United States Patent
Rao et al.

(10) Patent No.: US 7,642,163 B2
(45) Date of Patent: Jan. 5, 2010

(54) PROCESS OF FORMING AN ELECTRONIC DEVICE INCLUDING DISCONTINUOUS STORAGE ELEMENTS WITHIN A DIELECTRIC LAYER

(75) Inventors: Rajesh A. Rao, Austin, TX (US); Tushar P. Merchant, Austin, TX (US); Ramachandran Muralidhar, Austin, TX (US); Gowrishankar Chindalore, Austin, TX (US); David Sing, Austin, TX (US); Jane Yater, Austin, TX (US)

(73) Assignee: Freescale Semiconductor, Inc, Austin, TX (US)

( * ) Notice: Subject to any disclaimer, the term of this patent is extended or adjusted under 35 U.S.C. 154(b) by 377 days.

(21) Appl. No.: 11/693,829

(22) Filed: Mar. 30, 2007

(65) Prior Publication Data

US 2008/0242022 A1    Oct. 2, 2008

(51) Int. Cl.
  *H01L 21/336*    (2006.01)
(52) U.S. Cl. ............... 438/260; 438/288; 257/E21.423
(58) Field of Classification Search ............... 438/260, 438/288, 473, 962; 257/E21.423
  See application file for complete search history.

(56) References Cited

U.S. PATENT DOCUMENTS 5,395,771 A * 3/1995 Nakato ................ 438/766
6,096,625 A * 8/2000 Daniel et al. ............... 438/473
6,774,061 B2   8/2004 Coffa et al.

OTHER PUBLICATIONS

Liu, Zengtao et al.; "Metal Nanocrystal Memories—Part I: Device Design and Fabrication"; IEEE Transactions on Electron Devices, vol. 49, No. 9, Sep. 2002; pp. 1606-1613.
Ng, C.Y et al.; "Impact of Programming Mechanisms on the Performance and Reliability of Nonvolatile Memory Devices Based on Si Nanocrystals"; IEEE Transactions on Electron Devices, vol. 53, No. 4, Apr. 2006; pp. 663-667.
Muller, Torsten et al.; "Size and location control of Si nanocrystals at ion beam synthesis in thin SiO2 films"; Applied Physics Letters, vol. 81, No. 16, Oct. 14, 2002; pp. 3049-3051.

* cited by examiner

*Primary Examiner*—Chandra Chaudhari

(57) ABSTRACT

An electronic device can include a nonvolatile memory cell having DSEs within a dielectric layer. In one aspect, a process of forming the electronic device can include implanting and nucleating a first charge-storage material to form DSEs. The process can also include implanting a second charge-storage material and growing the DSEs such that the DSEs include the first and second charge-storage material. In another aspect, a process of forming the electronic device can include forming a semiconductor layer over a dielectric layer, implanting a charge-storage material, and annealing the dielectric layer. After annealing, substantially none of the charge-storage material remains within a denuded zone within the dielectric layer. In a third aspect, within a dielectric layer, a first set of DSEs can be spaced apart from a second set of DSEs, wherein substantially no DSEs lie between the first set of DSEs and the second set of DSEs.

20 Claims, 4 Drawing Sheets

US 7,642,163 B2

PROCESS OF FORMING AN ELECTRONIC DEVICE INCLUDING DISCONTINUOUS STORAGE ELEMENTS WITHIN A DIELECTRIC LAYER

BACKGROUND

1. Field of the Disclosure

The present disclosure relates to electronic devices including discontinuous storage elements within a dielectric layer and, more particularly, to nonvolatile memory cells that include discontinuous storage elements within a dielectric layer and processes of forming them.

2. Description of the Related Art

An electronic device can include a nonvolatile memory cell including discontinuous storage elements ("DSEs") within a dielectric layer. Such DSEs can be silicon nanocrystals. Silicon nanocrystals are desirable because a defect in the dielectric layer can compromise the ability of one silicon nanocrystal to store charge, without affecting the ability of another silicon nanocrystal to store charge. Thus, the nonvolatile memory cell including silicon nanocrystals can continue to function with a defect in the dielectric layer when a floating gate electrode with such a defect would fail to store charge.

However, silicon nanocrystals can have limitations. For example, quantum effects in silicon nanocrystals below 2 nm in size can negatively affect the ability of the silicon nanocrystals to store charge. Also, silicon nanocrystals can be so large that they merge into a continuous mass and have the same vulnerability to be compromised by a dielectric defect as a floating gate electrode. Another limitation of silicon nanocrystals is that the dielectric material used to encapsulate the silicon nanocrystals can be conventionally deposited and of lower quality than a thermally grown dielectric material. This lower-quality deposited dielectric material can be degrade more quickly due to charge trapping in the dielectric material, trap assisted charge loss from the silicon nanocrystals through the deposited dielectric material, or any combination thereof than thermally grown dielectric material.

Silicon nanocrystals can be formed using a low energy (at most 2 KeV) ion implantation of silicon into an oxide layer. Ion implantation can be followed by an anneal process to allow the implanted silicon to coalesce into silicon nanocrystals. The energy of the implant controls the projected range at which the silicon is placed within the oxide layer and the implant dose can determine the final thickness and structure of the resulting charge-storage layer. However, at 1 KeV energy, a peak silicon dose is predicted to lie at a depth of 4 to 5 nm, with a measurable amount at the surface of the oxide layer. Thus, the thickness of the oxide layer receiving the ion implant is at least in part determined by the ability to control the depth of the implant at low energy levels. Also, below a limit of 5E15 atoms per $cm^2$, the implanted silicon is predicted to coalesce into spheres of up to 3 nm in diameter. However, at a dose of 1E16 atom per $cm^2$, implanted silicon is predicted to form a spatially connected layer of silicon within the oxide layer. In one example, ion implanting using an energy of 2 KeV and a dose of 5E16 atoms per $cm^2$ forms a continuous silicon mass of approximately 4.5 nm in thickness.

BRIEF DESCRIPTION OF THE DRAWINGS

The present disclosure may be better understood, and its numerous features and advantages made apparent to those skilled in the art by referencing the accompanying drawings.

The subject of the disclosure is illustrated by way of example and not limitation in the accompanying figures.

Figure 1:
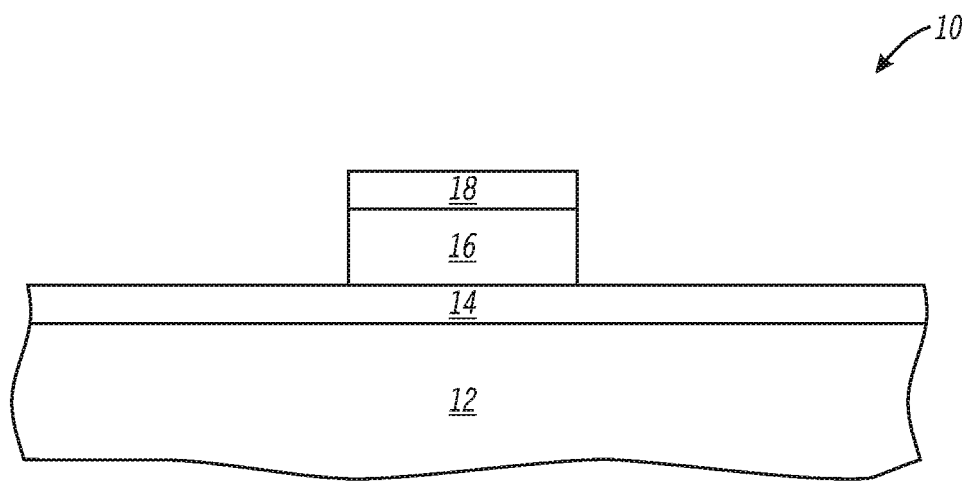
FIG. 1 includes an illustration of a cross-sectional view of a workpiece including a gate dielectric layer overlying a substrate, an electrode layer over the gate dielectric layer, and a protective layer.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention. The use of the same reference symbols in different drawings indicates similar or identical items.

DETAILED DESCRIPTION

An electronic device can include a nonvolatile memory cell having DSEs within a dielectric layer. In one aspect, a process of forming the electronic device can include implanting and nucleating a first charge-storage material to form DSEs. The process can also include implanting a second charge-storage material and growing the DSEs such that the DSEs include the first and second charge-storage material. In another aspect, a process of forming the electronic device can include forming a semiconductor layer over a dielectric layer, implanting a charge-storage material into the dielectric layer, and annealing the dielectric layer. After annealing, substantially none of the charge-storage material remains within a denuded zone within the dielectric layer and adjacent to the semiconductor layer. In a particular embodiment, ion implantation is performed at an acute incident angle to a major surface of a substrate. In a third aspect, within a dielectric layer, a first set of DSEs can be spaced apart from a second set of DSEs with substantially no DSEs between the first set of DSEs and the second set of DSEs.

By introducing the charge-storage material using a directional process, topography overlying the substrate can cause gaps in the coverage of the DSEs within the dielectric layer. Such gaps can be systematically formed and used to advantage. For example, storage elements in a region between the select gate electrode and the control gate electrode adjacent to a channel region can be difficult to erase. In a particular embodiment, a lower portion of the dielectric layer along a wall of a control gate includes substantially no storage elements. Substantially eliminating formation of storage elements from the region can help reduce the number of erase cycles required to erase a nonvolatile memory cell, thus extending the usable life of an electronic device including the nonvolatile memory cell.

Also, by using a plurality of implant and anneal processes, a higher total dose of charge-storage material can be used to form the DSEs without the implanted charge-storage material agglomerating into a substantially continuous mass. DSEs formed and subsequently grown using multiple implant and anneal process cycles can have a larger averaged size than those formed with a single implant and anneal cycle. Also, a denuded zone can be formed within the dielectric layer and adjacent to the semiconductor layer if the semiconductor layer is formed. The denuded zone can improve the electrical insulation between the DSEs and a subsequently formed control gate electrode without performing an additional process. In a particular embodiment, a denuded zone can act as a dielectric layer between the DSEs and the subsequently formed control gate electrode, thus eliminating a process sequence from the process flow. Specific embodiments of the present disclosure will be better understood with reference to FIGS. 1 through 10.

The term "averaged," when referring to a value, is intended to mean an intermediate value between a high value and a low value. For example, an averaged value can be an average, a geometric mean, or a median.

The term "discontinuous storage elements" ("DSEs") is intended to mean spaced-apart objects capable of storing a charge.

The term "size" when referring to a discontinuous storage element is intended to mean a length of a longest chord lying within the discontinuous storage element.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

Additionally, for clarity purposes and to give a general sense of the scope of the embodiments described herein, the use of the "a" or "an" are employed to describe one or more articles to which "a" or "an" refers. Therefore, the description should be read to include one or at least one whenever "a" or "an" is used, and the singular also includes the plural unless it is clear that the contrary is meant otherwise.

Unless otherwise defined, all technical and scientific terms used herein have the same meaning as commonly understood by one of ordinary skill in the art to which this invention belongs. In case of conflict, the present specification, including definitions, will control. In addition, the materials, methods, and examples are illustrative only and not intended to be limiting.

To the extent not described herein, many details regarding specific materials, processing acts, and circuits are conventional and may be found in textbooks and other sources within the semiconductor and microelectronic arts. Other features and advantages of the invention will be apparent from the following detailed description, and from the claims.

FIG. 1 includes an illustration of a cross-sectional view of a workpiece 10 including a substrate 12, a gate dielectric layer 14, an electrode layer 16 and a protective layer 18. Substrate 12 includes a semiconductor material such as silicon, germanium, carbon, another semiconductor material, such as a III-V material or a II-VI material, or any combination thereof. Although illustrated as a bulk semiconductor material, the substrate 12 can include other types of substrates capable of forming an electronic device such as a semiconductor on sapphire, a semiconductor on insulator, or another semiconductor substrate.

The dielectric layer 14 is formed over the substrate 12. In the illustrated embodiment, the dielectric layer 14 serves as a gate dielectric for a subsequently formed gate electrode. The dielectric layer 14 includes an oxide, a nitride, an oxynitride, or any combination thereof and has a thickness in a range of approximately 1 to approximately 30 nm. In a particular embodiment, the dielectric layer 14 has a thickness in a range of approximately 2 to approximately 8 nm. In another particular embodiment, the dielectric layer 14 has a thickness in a range of approximately 10 to approximately 30 nm. The dielectric layer 14 may also have other thicknesses. In another embodiment, the dielectric layer 14 includes a high-k dielectric material. The dielectric layer 14 is grown or deposited using a conventional or proprietary technique.

The electrode layer 16 overlies the dielectric layer 14. In the illustrated embodiment, the electrode layer 16 is a conductive layer and can be used to form a gate electrode. The electrode layer 16 includes a conductive material such as a metal, a metal alloy, a metal compound, a doped semiconductor material (e.g. doped polysilicon, doped SiGe), or any combination thereof. The electrode layer 16 is formed using a conventional or proprietary physical vapor deposition ("PVD") process, chemical vapor deposition ("CVD") process, atomic layer deposition ("ALD") process, or any combination thereof. In one embodiment, the electrode layer 16 has a thickness in a range of approximately 50 to approximately 500 nm.

The protective layer 18 overlies the electrode layer 16 and serves to protect the surface of the electrode layer 16 during subsequent processing. In the illustrated embodiment, the protective layer 18 serves as a hard mask during a subsequently performed process. The protective layer 18 can serve as a barrier to unwanted reaction at the surface of the electrode layer 16. In another embodiment, the protective layer 18 serves as a barrier to ion implantation. The protective layer 18 includes an oxide, a nitride, an oxynitride, or any combination thereof. The protective layer 18 is deposited using a process previously described with respect to the electrode layer 16, a thermal growth process, or any combination thereof. The protective layer 18 and the electrode layer 16 can be lithographically patterned and etched using a conventional or proprietary process. The protective layer 18 has a thickness in a range of approximately 5 to approximately 50 nm.

Figure 2:
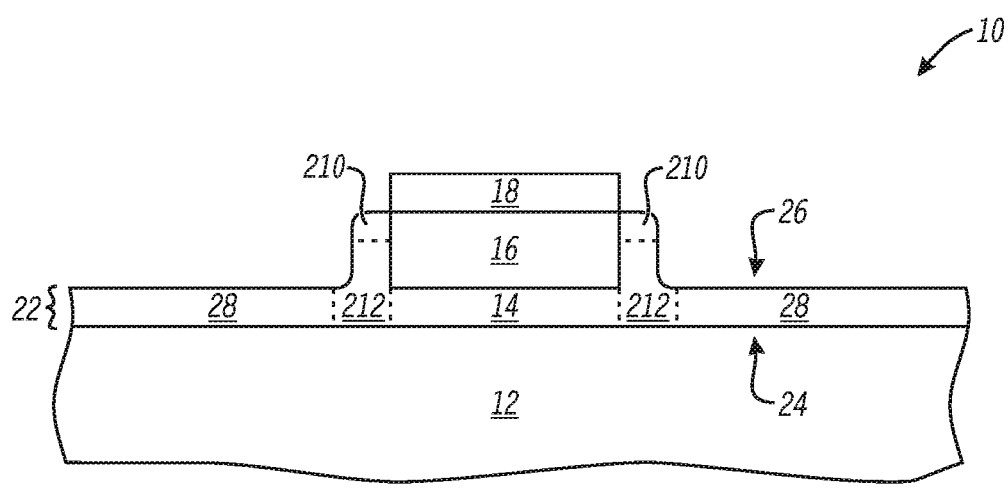
FIG. 2 includes an illustration of a cross-sectional view of the workpiece of FIG. 1 after forming a dielectric layer.

FIG. 2 includes an illustration of a cross-sectional view of the workpiece 10 of FIG. 1 after forming a dielectric layer 22. The dielectric layer 22 includes a substrate region 28, an elevated region 210, and a connecting region 212. In the illustrated embodiment, a portion of the dielectric layer 14 is removed to expose the substrate 12. The protective layer 18 serves to protect the electrode layer 16 during subsequent formation of dielectric layer 22. The dielectric layer 22 is formed over exposed portions of the substrate 12 and the electrode layer 16. The dielectric layer 22 is formed using an embodiment and including a material previously described for the dielectric layer 14. In a particular embodiment, the dielectric layer 22 includes substantially no hydrogen.

As illustrated, the dielectric layer 22 is thermally grown by exposing a surface portion of the workpiece 10 to an oxidizing or nitridizing environment. The dielectric layer 22 has a side 24 that is a closest side to the substrate 12, and a side 26 opposite the side 24. The substrate region 28 extends between the side 24 and the side 26 and lies adjacent to the substrate 12. The elevated region 210 extends between the side 24 and the side 26 and includes the upper-most portion of the dielectric layer 22 adjacent to a wall of the electrode layer 16. The connecting region 212 extends between the side 24 and the side 26 and lies between the substrate region 28 and the elevated region 210. As will be explained later in this specification, DSEs will be formed within the substrate region 28 and the elevated region 210. Substantially no DSEs will be formed within the connecting region 212. The side 24 and the side 26 are separate by a thickness. In one embodiment, the dielectric layer 22 has a thickness in a range of approximately 5 to approximately 25 nm. In another embodiment, the dielectric layer 22 has a thickness in a range of approximately 10 to approximately 20 nm.

Figure 3:
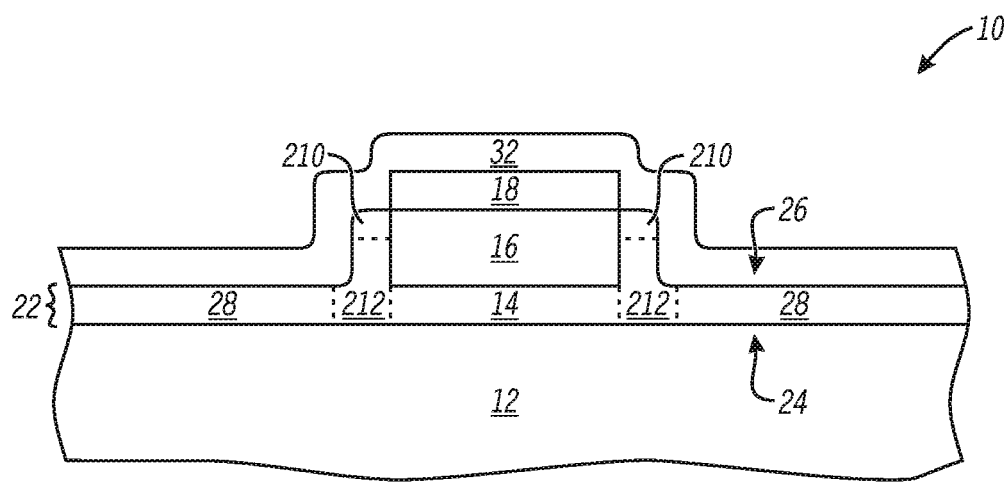
FIG. 3 includes an illustration of a cross-sectional view of the workpiece of FIG. 2 after forming a semiconductor layer over the dielectric layer.

FIG. 3 includes an illustration of a cross-sectional view of the workpiece 10 of FIG. 2 after forming a semiconductor layer 32 over the dielectric layer 22. The semiconductor layer 32 can subsequently help form a denuded zone within the dielectric layer 22, provide additional thickness for control of a projected range of a subsequent ion implantation, or any combination thereof. The semiconductor layer 32 includes a semiconductor material such as silicon, germanium, carbon, or any combination thereof. In a particular embodiment, the semiconductor layer 32 includes a same material as a subsequently performed ion implantation species, such that any material from the semiconductor layer 32 within the dielectric layer 22 after the ion implantation would be less likely to negatively effect the performance of a subsequently formed electronic device. In a more particular embodiment, the semiconductor layer 32 includes primarily silicon. The semiconductor layer 32 can have a thickness in a range of up to 30 nm. The semiconductor layer 32 can be formed using an embodiment as previously described with respect to the electrode layer 16. Although illustrated with the semiconductor layer 32, in another embodiment, the semiconductor layer 32 may not be formed.

Figure 4:
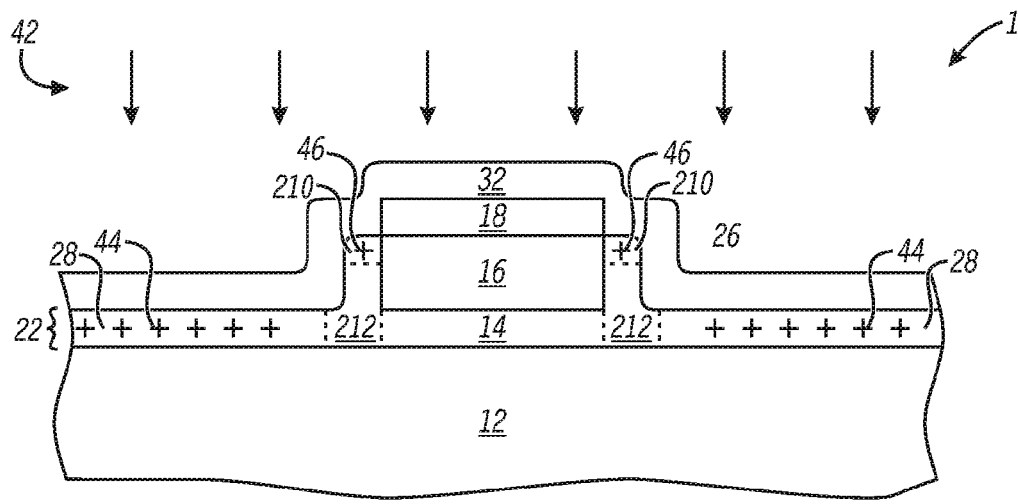
FIG. 4 includes an illustration of a cross-sectional view of the workpiece of FIG. 3 during implanting a first charge-storage material in to the dielectric layer.

FIG. 4 includes an illustration of a cross-sectional view of the workpiece 10 of FIG. 3 during ion implanting a charge-storage material 42 to lie within the dielectric layer 22. The charge-storage material 42 is implanted within the dielectric layer 22 to place material at a projected range for the subsequent formation of a set of DSEs. The charge-storage material 42 can include a semiconductor material such as those listed with respect to the semiconductor layer 32. In another embodiment, the charge-storage material 22 can include a metal such as platinum, palladium, iridium, osmium, ruthenium, rhenium, indium-tin, indium-zinc, aluminum-tin, or any combination thereof. In a particular embodiment, the charge-storage material 42 includes silicon when the semiconductor layer 32 includes silicon.

The charge-storage material 42 is implanted at a selected energy and dose. The implant energy is selected such that a projected range for the charge-storage material 42 lies within the dielectric layer 22. In one embodiment, the combined thickness of the semiconductor layer 32 and the dielectric layer 22 is selected such that the implant energy has a range of approximately 1 KeV to approximately 20 KeV. The dose of the charge-storage material 42 is selected such that DSEs can be formed including the charge-storage material 42 without agglomerating into a continuous mass and to meet the desired nanocrystal density. The dose at which the charge-storage material 42 agglomerates into a continuous mass can depend on the charge-storage material 42, the material of the dielectric layer 22, conditions of subsequent thermal cycling of the substrate 12, or any combination thereof. In one embodiment, the dose lies in a range of approximately 1E15 to approximately 1E16 ions per $cm^2$. In a particular embodiment, the dose is not greater than approximately 5E15 ions per $cm^2$.

In the illustrated embodiment, the implant angle is substantially normal to a major surface of the substrate 12. A portion 44 of the charge-storage material 42 lies within the substrate region 28 of the dielectric layer 22. Also, a portion 46 of the charge-storage material 42 lies within the elevated region 210. The portion 44 and the portion 46 are spaced apart from each other by the connecting region 212. A distance between the portion 44 and the portion 46 is at least approximately 10 nm. In one embodiment, the distance between the portion 44 and the portion 46 is at least approximately twice the thickness of the dielectric layer 22. In another embodiment, the elevated region 210 and the connecting region 212 lie along the wall of the gate electrode layer 16. The combination of the dielectric layer 22 and the semiconductor layer 32 along a wall of the gate electrode layer 16 acts as a spacer during the ion implantation. The elevated region 210 substantially blocks implantation of charge storage material 42 from reaching the connecting region 212. In a particular embodiment, the connecting region 212 of the dielectric layer 22 includes substantially none of the charge-storage material 42 after the charge-storage material 42 has been implanted into the dielectric layer 22.

Figure 5:
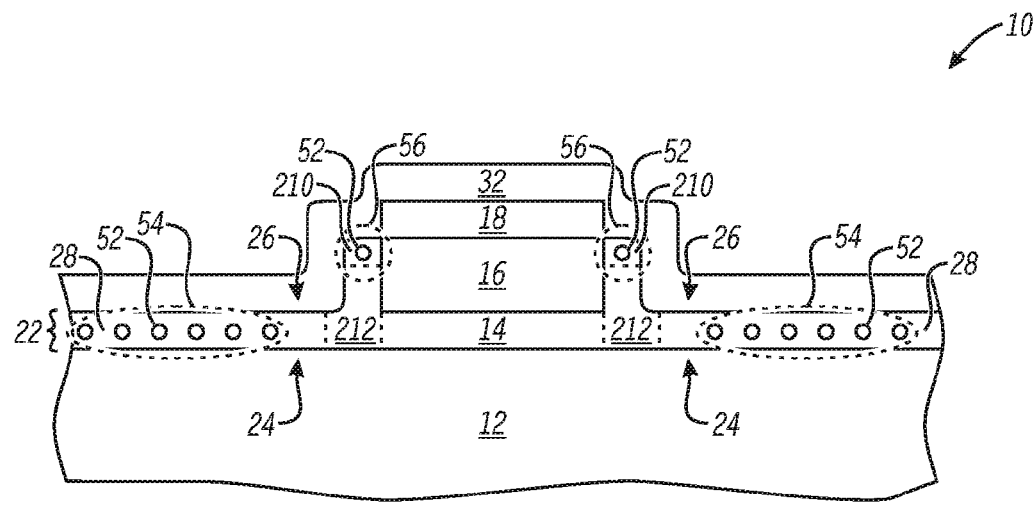
FIG. 5 includes an illustration of a cross-sectional view of the workpiece of FIG. 4 after annealing the dielectric layer to form a set of DSEs.

FIG. 5 includes an illustration of a cross-sectional view of the workpiece 10 of FIG. 4 after forming a set of DSEs 52 including a portion 54 and a portion 56. The workpiece 10, including the dielectric layer 22, is annealed such that the charge-storage material 42 can diffuse and agglomerate to form nuclei and grow into a set of DSEs 52. In the illustrated embodiment, the portion 44 of the charge-storage material 42 forms the portion 54 of DSEs 52 that lies within the substrate region 28 of the dielectric layer 22. The portion 46 of the charge-storage material 42 forms the portion 56 of DSEs 52 that lies within the elevated region 210 of the dielectric layer 22. In a particular embodiment, the portion 54 and the portion 56 are separated by a distance as previously described with respect to the portion 44 and the portion 46 of the charge-storage material 42. The anneal temperature lies in a range of approximately 700 to approximately 1000 degrees centigrade. In one embodiment, the environment includes nitrogen, helium, argon, or any combination thereof. In a particular embodiment, the anneal takes place such that there is substantially no oxidation during formation of DSEs 52.

In a particular embodiment, the substrate 12, the semiconductor layer 32, and the charge-storage material 42 include silicon. A portion of the charge-storage material 42 within the dielectric layer 22 diffuses to nucleation sites such that the charge-storage material 42 can agglomerate to form a set of DSEs 52. In the illustrated embodiment, another portion of the charge-storage material 42 can also diffuse into the substrate 12, the semiconductor layer 32, or any combination thereof. The semiconductor layer 32 and substrate 12 can act as sink sites for the charge-storage material 42. Thus, after annealing the workpiece 10, a denuded zone including substantially none of the charge-storage material 42 can lie adjacent to the side 24, the side 26 or any combination thereof. The thickness of the denuded zone has a range of approximately 1 to approximately 4 nm. A thickness of the denuded zone can vary with the nucleation and anneal conditions. In a more particular embodiment, substantially no storage element of the set of DSEs 52 forms within the denuded zone adjacent to the side 26. In another particular embodiment, the denuded zone adjacent to the side 24 and the denuded zone adjacent to the side 26 have substantially the same thickness.

Figure 6:
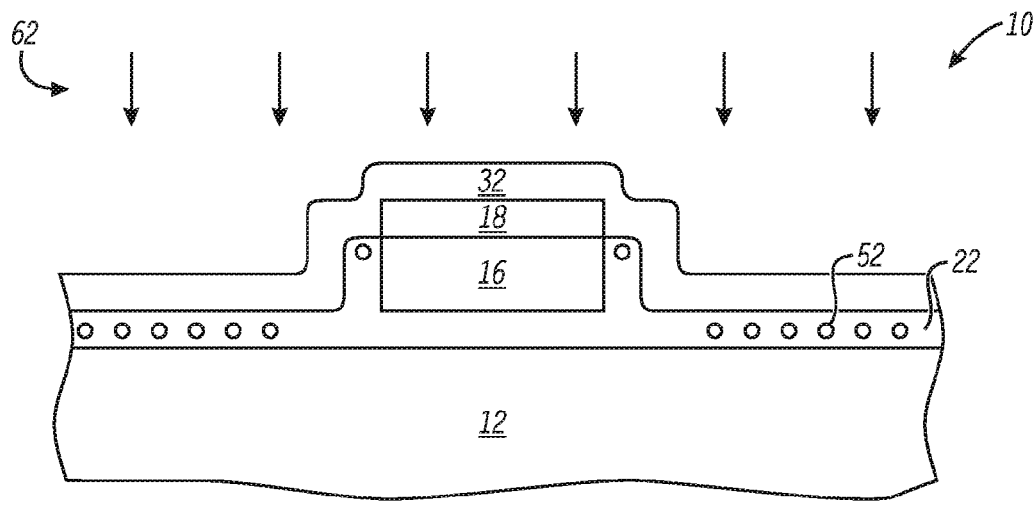
FIG. 6 includes an illustration of a cross-sectional view of the workpiece of FIG. 5 during implanting a second charge-storage material in to the dielectric layer.

FIG. 6 includes an illustration of a cross-sectional view of the workpiece 10 of FIG. 5 during ion implanting a charge-storage material 62 to lie within the dielectric layer 22. The charge-storage material 62 is implanted to place charge-storage material 62 within the dielectric layer 22 for the subsequent growth of the set of DSEs 52. The charge-storage material 62 includes a material previously listed with respect to the charge-storage material 42. The charge-storage material 62 is implanted using an embodiment previously discussed with respect to the charge-storage material 42. The charge-storage material 62 can be formed of a same or different material using a same or different process as the charge-storage material 42.

In one embodiment, implantation conditions are selected such that the charge-storage material 62 is implanted to lie within the dielectric layer 22 at substantially the same projected range as the charge-storage material 42. In another embodiment, the charge-storage material 62 and the charge-storage material 42 include a same material. In still another embodiment, a total dose includes the charge-storage material 42 and the charge-storage material 62 and is greater than approximately 1E16 ions per $cm^2$. In a particular embodiment, the total dose lies in a range of approximately 1E16 to approximately 1E17 ions per $cm^2$. In another particular embodiment, the charge-storage material 62 is implanted at a dose greater than approximately 1E16 atoms per $cm^2$.

Figure 7:
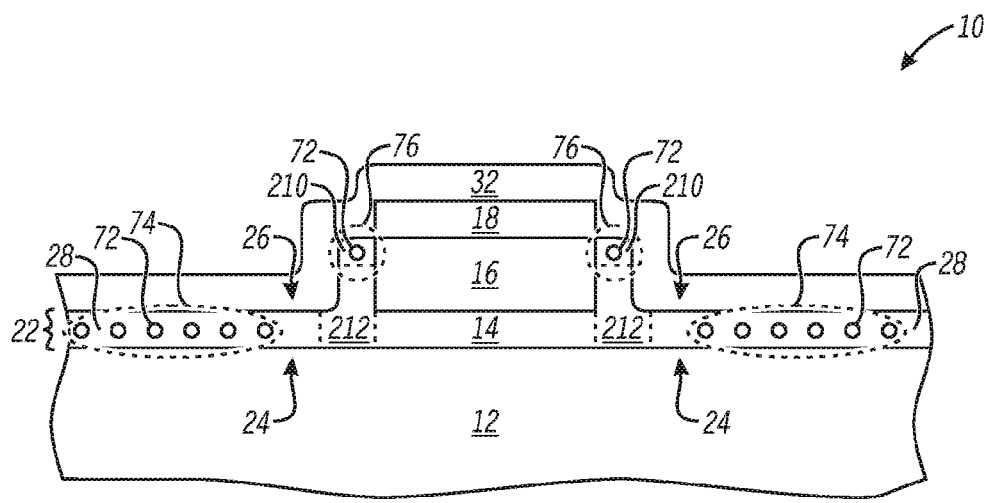
FIG. 7 includes an illustration of a cross-sectional view of the workpiece of FIG. 6 after growing the set of DSEs.

FIG. 7 includes an illustration of a cross-sectional view of the workpiece 10 of FIG. 6 after forming a set of DSEs 72 including a portion 74 and a portion 76. The workpiece 10, including the dielectric layer 22, is annealed such that the set of DSEs 52 can grow to form the set of DSEs 72. In one embodiment, the DSEs 72 include the charge-storage material 62. In the illustrated embodiment, a portion of the charge-storage material 62 within the dielectric layer 22 diffuses to the set of DSEs 52 and contributes to their growth. Another portion of implanted charge storage material that lies in the denuded zones can subsequently diffuse into the substrate 12, the semiconductor layer 32, or any combination thereof. Annealing is performed using a same or different embodiment previously described with respect to nucleating the charge-storage material 42. The portion 74 of DSEs 72 is grown from the portion 54 of the DSEs 52. The portion 76 of the DSEs 72 is grown from the portion 56 of the DSEs 52. In one embodiment, after annealing, the DSEs 72 have an averaged size of at least 3.1 nm. In another embodiment, the set of DSEs 72 includes the charge-storage material 42 and the charge-storage material 62.

In another particular embodiment, the charge-storage material 62 includes silicon. After growing the DSEs 72, a denuded zone can lie adjacent to the side 24, the side 26 or any combination thereof of the dielectric layer 22. The denuded zone can have a thickness in a range of approximately 1 to approximately 4 nm. The thickness of the denuded zone can vary with the nucleation and anneal conditions. In a more particular embodiment, substantially no storage element of the set of DSEs 72 forms within the denuded zone. In another particular embodiment, the denuded zone adjacent to the side 24 and the denuded zone adjacent to the side 26 have substantially the same thickness.

As illustrated, the portion 74 of the set of DSEs 72 lies within the substrate region 28 of the dielectric layer 22. The portion 76 of the set of DSEs 72 lies within the elevated region 210 of the dielectric layer 22. The substrate region 28 and the elevated region 210 are spaced-apart from each other by the connecting region 212. In one embodiment, the connecting region 212 includes a lower portion of the dielectric layer 22 along the wall of the remaining portion of the electrode layer 16. In another embodiment, substantially no storage element of the set of DSEs 72 lies within the connecting region 212. In a particular embodiment, the portion 74 and the portion 76 are separated by the distance as previously described with respect to the portion 44 and the portion 46 of the charge-storage material 42. Although not illustrated, in another embodiment, processing described with respect to the FIGS. 6 and 7 can be repeated until the set of DSEs 72 has a desired size and composition.

Figure 8:
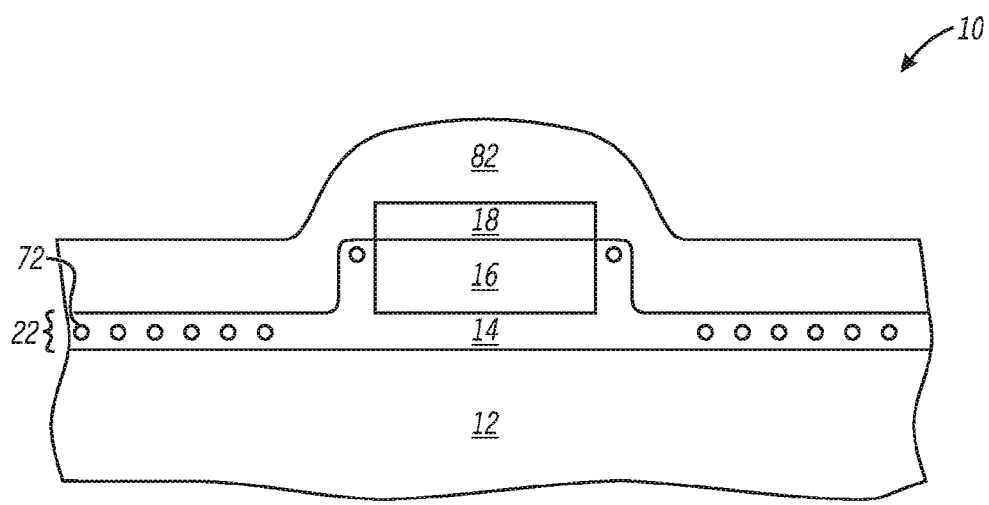
FIG. 8 includes an illustration of a cross-sectional view of the workpiece of FIG. 7 after forming a gate electrode layer.

FIG. 8 includes an illustration of a cross-sectional view of the workpiece 10 of FIG. 7 after forming an electrode layer 82. In the illustrated embodiment, the electrode layer 82 is formed over the substrate 12. The electrode layer 82 is formed using a material previously described for forming the electrode layer 16. The electrode layer 82 is formed using an embodiment previously describe with respect to the electrode layer 16. The electrode layer 82 can be formed using the same or different process or material as was used to form the electrode layer 16.

In a particular embodiment, the semiconductor layer 32 is removed prior to formation of the electrode layer 82. Removing the semiconductor layer 32 after forming the set of DSEs 52, the set of DSEs 72, or any combination thereof, can include removing a portion of the charge-storage material 42, the charge-storage material 62, or any combination thereof that was previously implanted into the dielectric layer 22. In a more particular embodiment (not illustrated), after removing the semiconductor layer 32, an optional dielectric layer can be deposited over the dielectric layer 22. In such a case, the portion 74 of the set of DSEs 72 can lie closer to the substrate 12 than the portion 74 lies to a subsequently formed control gate electrode. In another embodiment, the semiconductor layer 32 can remain as a portion of the workpiece 10 and act as a portion of the electrode layer 82.

Figure 9:
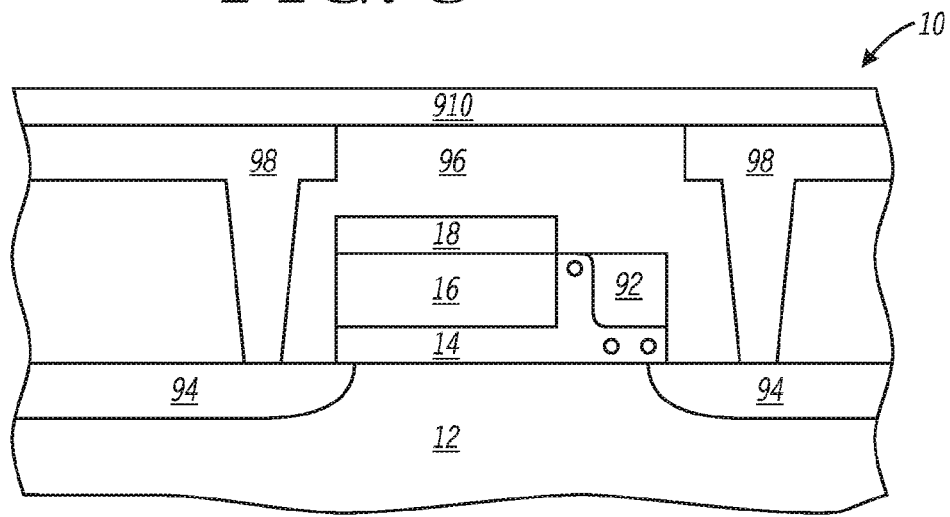
FIG. 9 includes an illustration of a cross-sectional view of a substantially complete electronic device.

FIG. 9 includes an illustration of a cross-sectional view of a substantially complete electronic device. As illustrated, a portion of the electrode layer 82 and an underlying portion of the dielectric layer 22 are removed to form a gate electrode 92. In the illustrated embodiment, the gate electrode 92 can act as a control gate electrode, and the remaining portion of the electrode layer 16 can act as a select gate electrode. The control gate electrode remains after removing portion of the electrode layer 82 and the dielectric layer 22 using a conventional or proprietary process. Source/drain regions 94, insulating layer 96, conductive layer 98, and encapsulating layer 910 are formed using conventional or proprietary process to form a substantially complete electronic device. In another embodiment, a plurality of insulating layers, conductive layers, encapsulating layers, or any combination thereof are used to form the electronic device.

Figure 10:
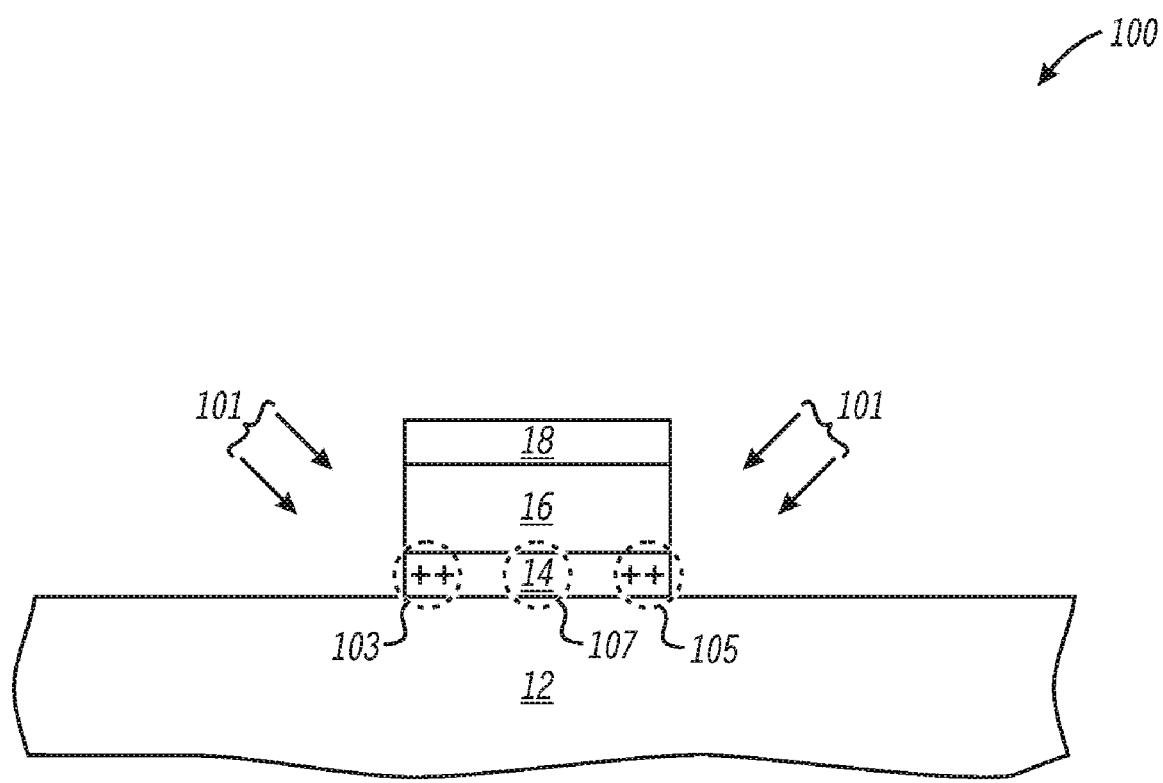
FIG. 10 includes an illustration of a cross-sectional view of another workpiece according to an alternative embodiment.

In an alternative embodiment, illustrated in FIG. 10, a set of DSEs including a first portion of DSEs spaced apart from a second portion of DSEs is formed within a substantially planar dielectric layer. FIG. 10 includes an illustration of a cross-sectional view of a workpiece 100 including a substrate 12, a dielectric layer 14, an electrode layer 16, and a hard mask 18 as previously described with respect to FIG. 1. After removing a portion of the electrode layer 16 by an embodiment previously described with respect to FIG. 2, the workpiece 100 can be implanted using an acute incident angle to the surface of the substrate. Although illustrated without the dielectric layer 22 and the semiconductor layer 32, in another embodiment, the dielectric layer 22, the semiconductor layer 32, or any combination thereof may be formed prior to ion implantation.

Also illustrated in FIG. 10, a charge-storage material 101 is implanted at an angle such that a portion of the charge-storage material 101 is implanted at a projected range that lies within the dielectric layer 14. A portion of the charge-storage material 101 lies within a region 103 within the dielectric layer 14, wherein the region 103 is adjacent to a wall of the gate electrode layer 16. Another portion of the charge-storage material 101 lies within a region 105 of the dielectric layer 14, wherein the region 105 lies adjacent to another wall of the gate electrode layer 16. The region 103 and the region 105 are spaced-apart from each other by a region 107 of the layer 14. In a particular embodiment, the projected range is such that the charge-storage material 101 passes through the dielectric layer 14 unless the charge-storage material 101 has previously passed through a portion of the electrode layer 16.

In one embodiment, the angle of the implant lies in a range of approximately 30 to approximately 45 degrees off of normal to the substrate. After subsequently annealing the substrate 12, wherein the substrate 12 includes the dielectric layer 14, a set of DSEs is formed within the dielectric layer 14. The set of DSEs includes a portion within the region 103 spaced apart from a portion within a region 105. In a particular embodiment, the substrate 12, the electrode layer 16, and the charge-storage material 101 primarily include silicon. In one embodiment, a cycle of implanting and subsequently annealing another charge-storage material is repeated until the set of DSEs have a desired size and composition. Exposed portions of the dielectric layer 14 are removed. A remaining portion of the dielectric layer 14, including the region 103, the region 105, and the region 107, lies between the electrode layer 16 and the substrate 12. A select gate electrode may, or may not be formed.

Source/drain regions, an insulating layer, a conductive layer, and an encapsulating layer are formed using conventional or proprietary process to form a substantially complete electronic device. In another embodiment, a plurality of insulating layers, conductive layers, encapsulating layers, or any combination thereof are used to form the electronic device.

Thus, a set of DSEs is formed by ion implanting a charge-storage material into a dielectric layer. Because the charge-storage material is placed within the dielectric layer using a directional process, the set of DSEs is formed including portions spaced apart from each other. In one embodiment, a set of DSEs including a first and a second charge-storage material is formed. In another embodiment, a denuded zone is formed between the set of DSEs and a control gate electrode. In still another embodiment, a set of DSEs is formed without forming difficult-to-erase DSEs between the control gate electrode and select gate electrode. By forming DSEs from material previously placed using ion-implantation, a thermally grown dielectric layer can be used to encapsulate the DSEs. Thus, potential problems associated encapsulating DSEs using a deposited dielectric layer can be substantially avoided.

Many different aspects and embodiments are possible. Some of those aspects and embodiments are described below. After reading this specification, skilled artisans will appreciate that those aspects and embodiments are only illustrative and do not limit the scope of the present invention.

In a first aspect, a process of forming an electronic device can include forming a nonvolatile memory cell, the process can include forming a dielectric layer over a substrate. The process can also include forming a set of discontinuous storage elements within the dielectric layer, wherein forming the set of discontinuous storage elements includes implanting a first charge-storage material into the dielectric layer at a first projected range that is within the dielectric layer, and nucleating the first charge-storage material to form the set of discontinuous storage elements. After nucleating the first charge-storage material the set of discontinuous storage elements lies within the dielectric layer, and the set of discontinuous storage elements includes the first charge-storage material. The process can also include implanting a second charge-storage material into the dielectric layer at a second projected range that is within the dielectric layer, and growing the set of discontinuous storage elements. After growing the set of discontinuous storage elements, the set of discontinuous storage elements includes the first charge-storage material and the second charge-storage material.

In one embodiment of the first aspect, the first charge-storage material and the second charge-storage material can include a same material. In another embodiment, the process can further include forming a semiconductor layer over the dielectric layer prior to implanting the first charge-storage material. In still another embodiment, implanting the first charge-storage material, implanting the second charge-storage material, or any combination thereof can include performing a blanket implant of the nonvolatile memory array.

In another embodiment of the first aspect, implanting the first charge-storage material can include implanting at an angle in a range of approximately 30 to approximately 45 degrees off a line perpendicular to a major surface of the substrate. In still another embodiment, nucleating the first charge-storage material, growing the set of discontinuous storage elements, or any combination thereof can be performed in a substantially non-oxidizing environment. In a particular embodiment, implanting the first charge-storage material can include implanting the first charge-storage material at a first dose, and implanting the second charge-storage material, can include implanting the second charge-storage material at a second dose. A total dose can include the first dose and the second dose, and the total dose can be greater than 1E16 atoms/cm$^2$. In a more particular embodiment, the first dose is less than 1E16 atoms/cm$^2$. In a still more particular embodiment, the second dose is greater than 1E16 atoms/cm$^2$.

In a second aspect, a process of forming an electronic device can include forming a nonvolatile memory cell, the process can include forming a dielectric layer over a substrate, and forming a semiconductor layer over the dielectric layer. The process can also include implanting a first charge-storage material at a first projected range that is within the dielectric layer, and annealing the dielectric layer. Annealing the dielectric layer can include diffusing a portion of the first charge-storage material from the dielectric layer into the semiconductor layer to form a first denuded zone within the dielectric layer, and after annealing the dielectric layer, substantially none of the first charge-storage material lies within the first denuded zone.

In a particular embodiment of the second aspect, annealing the dielectric layer further includes forming a set of discontinuous storage elements within the dielectric layer. After annealing the dielectric layer the first denuded zone lies between the set of discontinuous elements and the semiconductor layer, and the set of discontinuous storage elements includes the first charge-storage material. In a more particular embodiment, the process can further include implanting a second charge-storage material at a second projected range that is within the dielectric layer after annealing the dielectric layer, and growing the set of discontinuous storage elements. After growing the set of discontinuous storage elements, the set of discontinuous storage elements includes the second charge-storage material.

In another particular embodiment of the second aspect, the process can further include removing the semiconductor layer, and forming a control gate electrode. The set of discontinuous storage elements can lie between the control gate electrode and the substrate. In still another particular embodiment, annealing the dielectric layer can include forming a first portion of the set of discontinuous storage elements, and forming a second portion of the set of discontinuous storage elements spaced-apart from the first portion of discontinuous storage elements. Within the spaced-apart region, substantially no storage element is formed, and a closest distance from the first portion of discontinuous storage elements to the second portion of discontinuous storage elements is at least approximately three times the averaged size of the set of discontinuous storage elements.

In another embodiment of the second aspect, the process can further include forming a second denuded zone between the set of discontinuous storage elements and the substrate, wherein the first denuded zone and the second denuded zone have substantially a same thickness. In yet another embodiment, implanting the first charge-storage material can include implanting at an angle in a range of approximately 30 to approximately 45 degrees off a line perpendicular to a major surface of the substrate.

In a third aspect, an electronic device can include a nonvolatile memory cell wherein the nonvolatile memory cell includes a substrate, a dielectric layer overlying the substrate, wherein the dielectric layer includes a first side, a second side opposite the first side, wherein the first side and the second side are separated by a thickness. The electronic device can also include a first region extending between the first side and the second side, a second region spaced-apart from the first region and extending between the first side and the second side, and a third region lying between the first region and the second region, and extending between the first side and the second side. The first region, second region, and third region can be contiguous regions of the dielectric layer. The electronic device can further include discontinuous storage elements lying within the dielectric layer, wherein a first portion of discontinuous storage elements lies within the first region of the dielectric layer, and a second portion of discontinuous storage elements lies within the second region of the dielectric layer. Substantially no storage element of the discontinuous storage elements lies with in the third region, and a closest distance from the first portion to the second portion is at least approximately equal to the thickness of gate electrode layer.

In one embodiment of the third aspect, the electronic device can further include a control gate electrode overlying the dielectric layer, and a select gate electrode adjacent to the control gate electrode, wherein the third region of the dielectric layer lies between the control gate electrode and the select gate electrode. In another embodiment, the electronic device can further include a control gate electrode, wherein the control gate electrode overlies the first region, the second region, and the third region of the dielectric layer. In still another embodiment, the discontinuous storage elements can have an averaged size of at least approximately 3.1 nm.

Note that not all of the activities described above in the general description or the examples are required, that a portion of a specific activity may not be required, and that one or more further activities may be performed in addition to those described. Still further, the order in which activities are listed are not necessarily the order in which they are performed. After reading this specification, skilled artisans will be capable of determining which one or more activities or one or more portions thereof are used or not used and the order of such activities are to be performed for their specific needs or desires.

Any one or more benefits, one or more other advantages, one or more solutions to one or more problems, or any combination thereof have been described above with regard to one or more specific embodiments. However, the benefit(s), advantage(s), solution(s) to problem(s), or any element(s) that may cause any benefit, advantage, or solution to occur or become more pronounced is not to be construed as a critical, required, or essential feature or element of any or all the claims.

The above-disclosed subject matter is to be considered illustrative, and not restrictive, and the appended claims are intended to cover all such modifications, enhancements, and other embodiments that fall within the scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A process of forming an electronic device including a nonvolatile memory cell, the process comprising:
    forming a dielectric layer over a substrate; and
    forming a set of discontinuous storage elements within the dielectric layer, wherein forming the set of discontinuous storage elements includes:
        implanting a first charge-storage material into the dielectric layer at a first projected range that is within the dielectric layer;
        nucleating the first charge-storage material to form the set of discontinuous storage elements, wherein after nucleating the first charge-storage material:
            the set of discontinuous storage elements lies within the dielectric layer; and
            the set of discontinuous storage elements includes the first charge-storage material;
        implanting a second charge-storage material into the dielectric layer at a second projected range that is within the dielectric layer; and
        growing the set of discontinuous storage elements, wherein after growing the set of discontinuous storage elements, the set of discontinuous storage elements includes the first charge-storage material and the second charge-storage material.

2. The process of claim 1, wherein the first charge-storage material and the second charge-storage material include a same material.

3. The process of claim 1, further comprising forming a semiconductor layer over the dielectric layer prior to implanting the first charge-storage material.

4. The process of claim 1, wherein implanting the first charge-storage material, implanting the second charge-storage material, or any combination thereof includes performing a blanket implant of the nonvolatile memory array.

5. The process of claim 1, wherein implanting the first charge-storage material includes implanting at an angle in a range of approximately 30 to approximately 45 degrees off a line perpendicular to a major surface of the substrate.

6. The process of claim 1, wherein nucleating the first charge-storage material, growing the set of discontinuous storage elements, or any combination thereof is performed in a substantially non-oxidizing environment.

7. The process of claim 1, wherein:
implanting the first charge-storage material includes implanting the first charge-storage material at a first dose; and
implanting the second charge-storage material, includes implanting the second charge-storage material at a second dose, wherein:
a total dose includes the first dose and the second dose; and
the total dose is greater than 1E16 atoms/cm².

8. The process of claim 7, wherein the first dose is less than 1E16 atoms/cm².

9. The process of claim 8, wherein the second dose is greater than 1E16 atoms/cm².

10. A process of forming an electronic device including a nonvolatile memory cell, the process comprising:
forming a dielectric layer over a substrate;
forming a semiconductor layer over the dielectric layer;
implanting a first charge-storage material at a first projected range that is within the dielectric layer; and
annealing the dielectric layer, wherein:
annealing the dielectric layer includes diffusing a portion of the first charge-storage material from the dielectric layer into the semiconductor layer to form a first denuded zone within the dielectric layer; and
after annealing the dielectric layer, substantially none of the first charge-storage material lies within the first denuded zone.

11. The process of claim 10, wherein annealing the dielectric layer further includes forming a set of discontinuous storage elements within the dielectric layer, wherein after annealing the dielectric layer:
the first denuded zone lies between the set of discontinuous elements and the semiconductor layer; and
the set of discontinuous storage elements includes the first charge-storage material.

12. The process of claim 11, further including:
implanting a second charge-storage material at a second projected range that is within the dielectric layer after annealing the dielectric layer; and
growing the set of discontinuous storage elements, wherein, after growing the set of discontinuous storage elements, the set of discontinuous storage elements includes the second charge-storage material.

13. The process of claim 11, further comprising:
removing the semiconductor layer; and
forming a control gate electrode, wherein the set of discontinuous storage elements lies between the control gate electrode and the substrate.

14. The process of claim 11, wherein annealing the dielectric layer includes:
forming a first portion of the set of discontinuous storage elements; and
forming a second portion of the set of discontinuous storage elements spaced-apart from the first portion of discontinuous storage elements, wherein:

within the spaced-apart region, substantially no storage element is formed; and
a closest distance from the first portion of discontinuous storage elements to the second portion of discontinuous storage elements is at least approximately three times the averaged size of the set of discontinuous storage elements.

15. The process of claim 10, further including forming a second denuded zone between the set of discontinuous storage elements and the substrate, wherein the first denuded zone and the second denuded zone have substantially a same thickness.

16. The process of claim 10, wherein implanting the first charge-storage material includes implanting at an angle in a range of approximately 30 to approximately 45 degrees off a line perpendicular to a major surface of the substrate.

17. The process of claim 1, wherein:
forming the dielectric layer comprising forming the dielectric layer such that the dielectric layer includes:
a first side;
a second side opposite the first side, wherein the first side and the second side are separated by a thickness;
a first region extending between the first side and the second side;
a second region spaced-apart from the first region and extending between the first side and the second side; and
a third region lying between the first region and the second region, and extending between the first side and the second side, wherein the first region, second region, and third region are contiguous regions of the dielectric layer; and
forming the discontinuous storage elements comprising forming the discontinuous storage elements such that
a first portion of discontinuous storage elements lies within the first region of the dielectric layer; and
a second portion of discontinuous storage elements lies within the second region of the dielectric layer; and
substantially no storage element of the discontinuous storage elements lies with in the third region; and
a closest distance from the first portion to the second portion is at least approximately equal to the thickness of gate electrode layer.

18. The process of claim 17, further comprising:
a control gate electrode overlying the dielectric layer; and
a select gate electrode adjacent to the control gate electrode, wherein the third region of the dielectric layer lies between the control gate electrode and the select gate electrode.

19. The process of claim 17, further comprising a control gate electrode, wherein the control gate electrode overlies the first region, the second region, and the third region of the dielectric layer.

20. The process of claim 17, wherein the discontinuous storage elements have an averaged size of at least approximately 3.1 nm.

* * * * *